(12) United States Patent
Swanson

(10) Patent No.: US 7,365,593 B1
(45) Date of Patent: Apr. 29, 2008

(54) OUTPUT EQUALIZED CHARGE PUMP

(75) Inventor: Richard William Swanson, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/329,790

(22) Filed: Jan. 11, 2006

(51) Int. Cl.
    *G05F 1/10* (2006.01)
(52) U.S. Cl. ........................................ 327/536; 327/538
(58) Field of Classification Search .................... None
    See application file for complete search history.

(56) References Cited

U.S. PATENT DOCUMENTS

| | | | | |
|---|---|---|---|---|
| 5,416,437 | A | * | 5/1995 | Contreras et al. ............ 327/536 |
| 6,075,406 | A | * | 6/2000 | Lee et al. .................... 327/538 |
| 6,172,571 | B1 | * | 1/2001 | Moyal et al. ................. 331/11 |
| 6,980,045 | B1 | * | 12/2005 | Liu .............................. 327/536 |
| 2004/0215260 | A1 | * | 10/2004 | Vonk et al. .................... 607/11 |
| 2004/0257162 | A1 | * | 12/2004 | Mokeddem .................... 331/16 |
| 2005/0162213 | A1 | * | 7/2005 | Yoshimura .................. 327/536 |

OTHER PUBLICATIONS

Chris Ebeling et al.; "System Clock Management Simplified with Virtex-II Pro FPGAs"; WP190 (v1.0), Feb. 25, 2003; available from Xilinx, Inc., 2100 Logic Drive, San Jose, California 95124 or www.xilinx.com; pp. 1-9.

John G. Maneatis; "Low-Jitter Process-Independent DLL and PLL Based on Self-Biased Techniques"; IEEE Journal of Solid-State Circuits; vol. 31, No. 11; Nov. 1996; Copyright 1996 IEEE; pp. 1723-1732.

* cited by examiner

*Primary Examiner*—Cassandra Cox
(74) *Attorney, Agent, or Firm*—Scott Hewett

(57) ABSTRACT

A charge pump circuit has a charge pump section and a replica charge pump section. The replica charge pump section produces a replica voltage at which the UP current will match the DOWN current. A comparator compares the replica voltage to the output voltage, and adjusts the bias to the charge pump section and replica charge pump section so that the voltage level produced by the replica charge pump section matches the output voltage.

18 Claims, 7 Drawing Sheets ered to as the "UP" current source because, when switch 108 is closed and switch 110 is open, charge is added to the load 106, increasing $V_{OUT}$. The second current source 104 is commonly referred to as the "DOWN" current source because when switch 110 is closed and switch 108 is open, charge is removed from the load 106, decreasing $V_{OUT}$. The terms "UP" and "DOWN" are arbitrary, as are the polarities of the circuit elements. In other words, whether the charge added and removed from the load is positive or negative, and whether the voltage developed across the load is positive or negative, is arbitrary. The UP current sources are connected directly to $V_{CC}$ or a regulated supply, for example.

OUTPUT EQUALIZED CHARGE PUMP

FIELD OF THE INVENTION

This invention relates generally to electronic circuits, and more particularly to a charge pump used to produce a voltage in an integrated circuit.

BACKGROUND OF THE INVENTION

Charge pumps develop a voltage by adding or removing charge from a load, such as a capacitor. Adding charge to the capacitor increases the voltage across the capacitor, and removing charge decreases the voltage. Charge pumps are used in a variety of applications, such as to produce a control voltage used to tune a voltage-controlled oscillator ("VCO") in a phase-locked loop ("PLL"). In particular applications, a charge pump is included in a PLL of a digital clock manager ("DCM"), which is also known as a clock management tile ("CMT").

FIG. 1 is a diagram of a conventional charge pump 100. Current sources 102, 104 are selectively coupled to the output or load 106, which in this case is illustrated as a capacitor for purpose of convenient example and discussion, to add or remove charge. The load develops an output voltage $V_{OUT}$ 120, such as $V_C$ in a PLL that is used to control a VCO or other circuit, in which case $V_{OUT}$ is commonly referred to as a "control voltage" or a "filter voltage." A VCO/PLL is used only for purposes of convenient illustration. Charge pumps are used in a wide variety of applications.

The first current source 102 is commonly referred to as the "UP" current source because, when switch 108 is closed and switch 110 is open, charge is added to the load 106, increasing $V_{OUT}$. The second current source 104 is commonly referred to as the "DOWN" current source because when switch 110 is closed and switch 108 is open, charge is removed from the load 106, decreasing $V_{OUT}$. The terms "UP" and "DOWN" are arbitrary, as are the polarities of the circuit elements. In other words, whether the charge added and removed from the load is positive or negative, and whether the voltage developed across the load is positive or negative, is arbitrary. The UP current sources are connected directly to $V_{CC}$ or a regulated supply, for example.

The control voltage $V_{OUT}$ 120 is provided to a PLL (not shown) to control a VCO. A phase/frequency detector 112 provides control signals 114, 116 indicating whether the control voltage $V_{OUT}$ needs to change in order to tune the VCO to the proper phase or frequency. If the phase/frequency detector indicates that $V_{OUT}$ needs to be increased, the control signal 114 closes the UP switch 108 to transfer additional charge to the load 106. If the phase/frequency detector indicates that $V_{OUT}$ needs to be decreased, the control signal 116 closes the DOWN switch 110 to remove charge from the load 106. Only one of the switches 108, 110 is closed at any time and both switches are open if no adjustment to $V_{OUT}$ is required. However, in some applications, a technique is used that closes both switches 108, 110 for a short time during an UP or DOWN adjustment. This is done to cancel-out any non-ideal behavior of the switch that otherwise might lead to static phase offset.

The amount of charge added to or removed from the load 106 is determined according to the current of the current sources 102, 104 and the duration its corresponding switch is closed. In other words, one can determine the amount of charge added to the load 106 by knowing the current provided by UP current source 102 and the time UP switch 108 is closed. $V_{OUT}$ 120 is usually coupled to a high-impedance load, and it is typically assumed that essentially all of the charge is transferred to the load 106. However, even if there is some leakage through the output 120 or through the load 106, this would de-tune the VCO and result in the appropriate control signal being sent to re-tune the VCO to its desired frequency.

In typical applications, it is desirable that the charge added by an UP control signal is equal to the charge removed by a DOWN control signal because this leads to symmetric behavior of the PLL to both DOWN and UP adjustments. Additionally, the technique used to cancel-out non-ideal switch behavior by closing both switches for some amount of time relies on the fact that if both switches 108, 110 are closed, the currents will be canceled out and no net charge will be transferred to the load. Any offset between the UP and DOWN currents (i.e. the current provided by the UP current source 302 and the DOWN current source, respectively) will result in a net positive or negative charge being placed on the load when both switches 108, 110 are closed. This net charge will result in increased static phase offset.

When no change to the VCO is required, no control signal (i.e. an UP pulse or a DOWN pulse) is sent, or the charge pump is sent alternating UP and DOWN control signals. If the amount of charge transferred during a UP increment does not equal the amount of charge transferred during a DOWN increment, static phase error arises. It is highly desirable that the UP and DOWN control signals have the same duration, and that the UP and DOWN current sources provide the same current, since this greatly simplifies operation of the charge pump 100.

The charge pump 100 includes a current mirror section 122 that equalizes the UP and DOWN currents at a voltage level, which is a selected design parameter of the current mirror section 122. A voltage reference (not shown), such as a band-gap reference, is coupled to the DOWN current bias port 124. The voltage reference sets the operating point for a DOWN current mirror source 126 and for the DOWN current source 104. The current through the DOWN mirror current source 126 also depends on the voltage drop from node 128 to ground 130. In a particular embodiment, the voltage reference is coupled to the gate terminal of an FET, node 128 is coupled to the source of the FET, and the drain of the FET is coupled to ground 130.

The voltage at node 128 is typically greater than a transistor threshold voltage lower than the supply voltage $V_{CC}$ 132 provided to an UP mirror current source 134 and to the UP current source 102. In a particular embodiment, the UP mirror current source is diode-connected, allowing the voltage on node 128 to adjust itself to the correct bias point to supply the same current as the DOWN current source. The final voltage at node 128 is not only design-dependent but will also vary with process, voltage and temperature. The two current sources in the current mirror 134, 126 are replicated in the charge pump 102, 104 and may employ a multiplication factor.

If the output voltage, $V_{OUT}$ 120, is the same as the voltage on node 128, the currents will match, disregarding any device mismatch. However, as the output voltage level $V_{OUT}$ moves away from the voltage level of node 128, the difference between the UP current and the DOWN current increases due to the output impedance of the current sources, particularly in low-voltage circuits that use non-cascaded, single-transistor current sources.

One approach to minimize the difference between UP and DOWN currents is to use cascaded current sources, which increases the output impedance. This approach is not effective in low-voltage (e.g. about 1 Volt) circuits because there is not sufficient voltage headroom to provide cascaded current sources and still obtain the desired range of output voltage $V_{OUT}$. One result is that some charge pumps used in low-voltage circuits produce an undesirable mismatch between the UP and DOWN currents versus output voltage $V_{OUT}$.

Therefore, techniques for avoiding differences in UP and DOWN current in charge pumps are desired.

SUMMARY OF THE INVENTION

A charge pump circuit has a charge pump section and a replica charge pump section. The replica charge pump section outputs the voltage level at which the UP current will match the DOWN current. A comparator compares the replica voltage output to the output voltage of the charge pump, and adjusts the bias to the charge pump section and replica charge pump section so that the voltage level produced by the replica charge pump section matches the output voltage.

DETAILED DESCRIPTION OF THE DRAWINGS

Figure 2A:
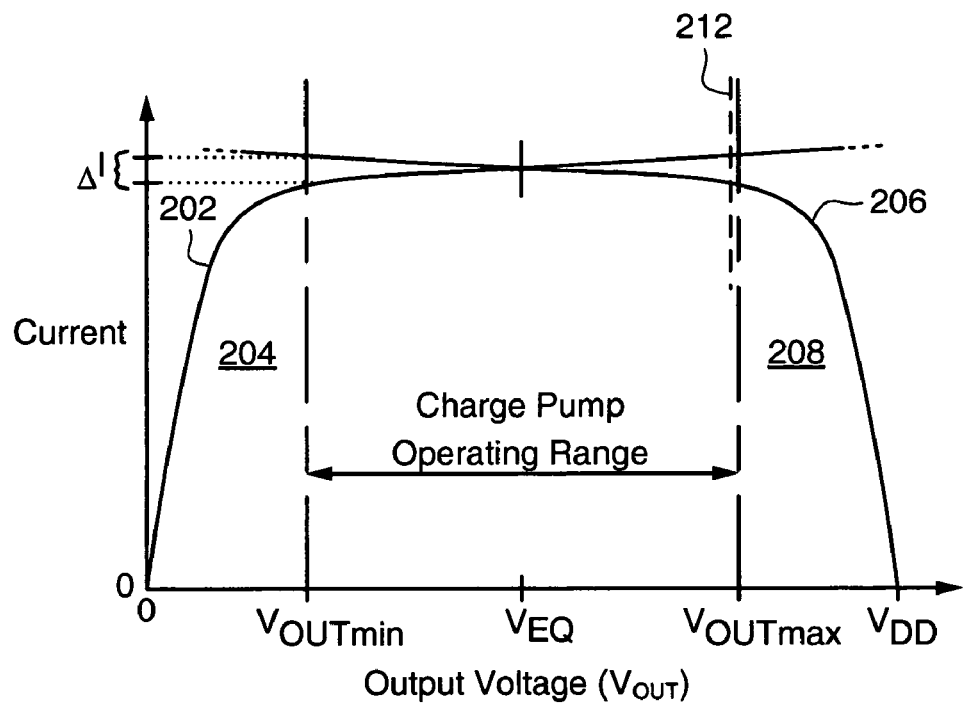
FIG. 2A shows plots of current versus output voltage illustrating current mismatch in a conventional charge pump.

FIG. 2A shows plots of current versus output voltage illustrating current mismatch in a conventional charge pump. A first plot 202 shows the current from an N-channel (DOWN) current source. The region from 0 to $V_{OUTmin}$ 204 represents the region where the N-channel current source is operating in the triode region causing the current to vary greatly as the output voltage changes. Region 204 is typically an unusable region. The region from $V_{OUTmin}$ to $V_{DD}$ is the usable region of the DOWN current source. The positive slope in the curve represents the effect of the output impedance of the DOWN current source. The magnitude of this slope can be very small in high impedance current source designs, such as cascaded designs, or very large in the case of single transistor current sources which are often found in low voltage applications (such as 1 Volt and below).

The second curve 206 shows the matched or mirrored UP current source. The region from $V_{OUTmax}$ to $V_{DD}$ 208 represents the region where the UP-channel current source is operating in the triode region causing the current to vary greatly as the output voltage changes. This region 208 is typically an unusable region. The region from 0 to $V_{OUTmax}$ is the usable region of the UP current source. The negative slope in the curve represents the effect of the output impedance of the current source. The magnitude of this slope can be very small in high impedance current source designs, such as cascaded designs, or very large in the case of single transistor current sources which are often found in low voltage applications (such as 1 Volt and below).

The point at which these two currents are equal is the equilibrium voltage $V_{EQ}$, which is the bias point of the current mirror. If the output voltage, $V_{OUT}$, is equal to this voltage level $V_{EQ}$ the UP and DOWN currents will be matched disregarding any device mismatch. However, if the output voltage is at another level such as 212 the UP and DOWN currents will have a mismatch as shown by ΔI. This difference in current ΔI will be referred to as current mismatch. Current mismatch can result in a static phase offset in a VCO. In a CMT application, this can mean that the internal clock of an IC is not phase aligned to the source clock of the system the IC is being used in, and it will increase the deterministic jitter of the output clock.

Generally, when the PLL is locked, a symmetrical signal is sent to the UP and DOWN current sources, which ideally add and remove the same amount of charge per cycle and do not change the output voltage (i.e. do not change the tuning point of the VCO or filter). For example, the control signals might be square waves that turn the UP current source ON for 100 ps and then turn the DOWN current source ON for 100 ps. The turn-on characteristics of the physical circuit limit the actual ON times to less than 100 ps, but the turn-on ramps of the UP and DOWN sections are usually very similar because they are integrated close to each other on the silicon, and track each other with variations in the fabrication processing, bias voltage, and temperature. However, if current mismatch occurs, such as when the output voltage is not at the equilibrium voltage, the amount of charge added will not equal the amount of charge removed, and the output voltage will drift, hence producing static phase offset.

Figure 2B:
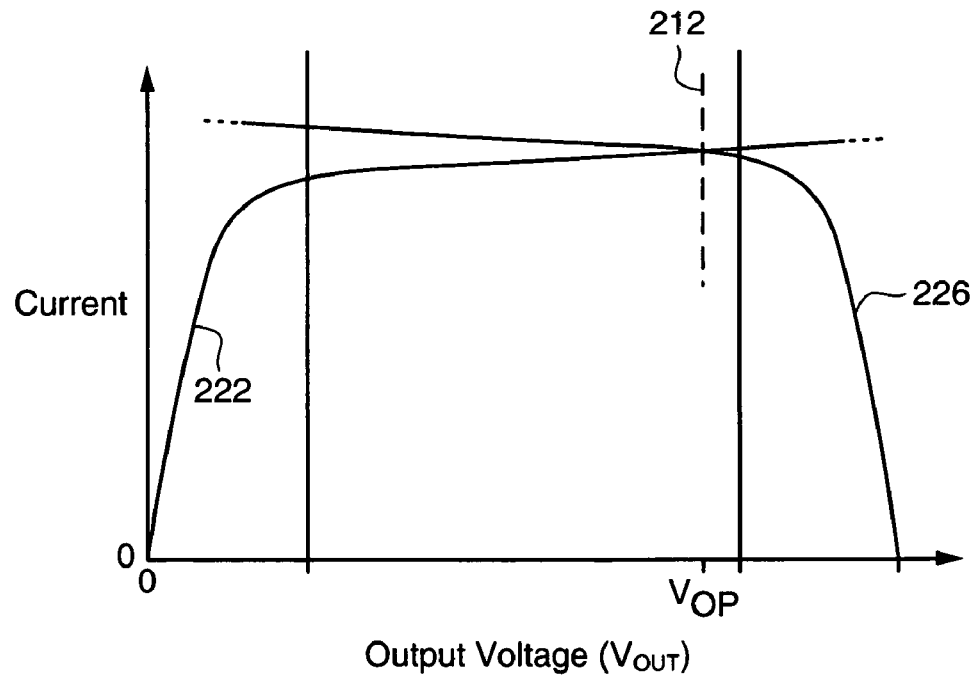
FIG. 2B shows plots of current versus output voltage for a charge pump according to an embodiment of the invention.

FIG. 2B shows plots of current versus output voltage for a charge pump according to an embodiment of the invention. A first plot 222 shows the current from an N-channel current source (see FIG. 4B, ref. num. 466) versus output voltage. A second plot 226 shows the desired current from a P-channel current source (see FIG. 4B, ref. num. 464) versus output voltage. The P-channel curve is modified to set the equilibrium point to be equal to the output voltage level 212 ($V_{OP}$). A similar modification can be shown for any operating point from $V_{OUTmin}$ to $V_{OUTmax}$. By using such a modification, the charge pump can have matched current for any point between $V_{OUTmin}$ and $V_{OUTmax}$.

Figure 3:
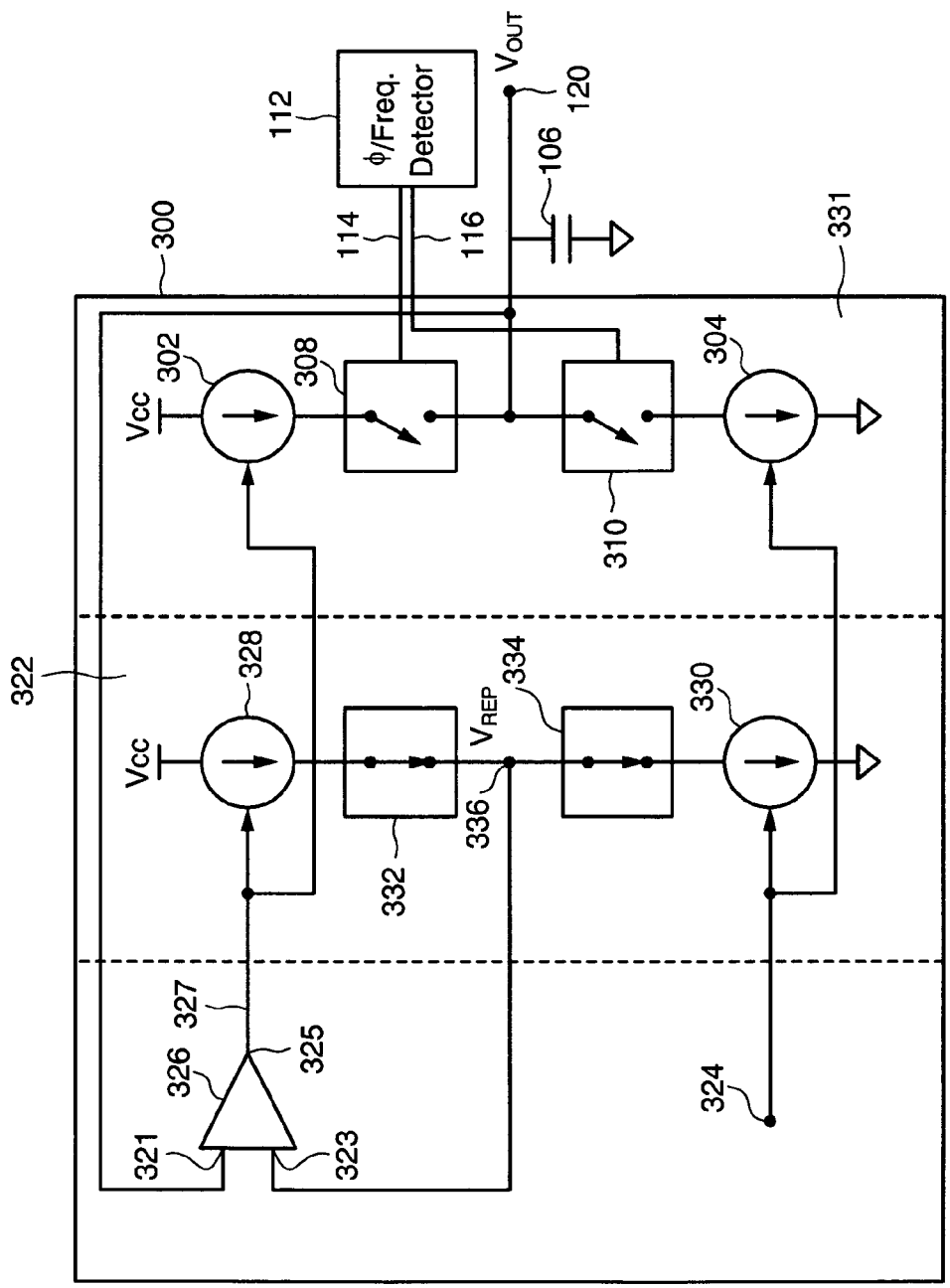
FIG. 3 is a diagram of a charge pump circuit according to an embodiment of the invention.

FIG. 3 is a diagram of a charge pump circuit 300 according to an embodiment of the invention. The charge pump circuit 300 has an UP current source 302 and a DOWN current source 304 coupled to the output shown as a load 106 through switches 308, 310. Alternatively, the output drives into a different type of load, such as an RC filter or a current mirror. For purposes of convenient discussion only, a capacitor is used as a load in this example. The switches are opened and closed according to control signals 114, 116 provided to the charge pump circuit 300 from a phase/frequency detector 112. The current sources 302, 304, switches 308, 310, and load 106 operate similarly to those described in FIG. 1. A substantially constant bias voltage, such as a reference voltage from a bandgap reference, is coupled to a DOWN current bias port 324.

The charge pump circuit 300 also has a charge pump replica section 322 and a comparator 326. The charge pump replica section 322 has replica current sources 328, 330, similar to the current sources in the current mirror section 122 of the charge pump 100 in FIG. 1. The replica current sources 328, 330 are replicas or scaled replicas of the current sources 302, 304 in the output section 331 of the charge pump.

The charge pump replica section 322 also has replica switch elements 332, 334. These replica switch elements 332, 334 are left closed to replicate the ON resistance of the switches 308, 310 in the output section 331 of the charge pump 300. The replica current sources 328, 330 and replica switch elements 332, 334 provide a resistance string in the charge pump replica section 322 that produces the voltage level ($V_{REF}$) at which the UP and DOWN currents are matched. In an alternative embodiment, other resistive elements are used instead of the replica switch elements; however, using replica switch elements is particularly desirable because they are easy to design and fabricate in a charge pump, and replicate the desired switch resistance over operating conditions and manufacturing variability.

The $V_{REF}$ 336 voltage level and the charge pump output voltage $V_{OUT}$ 120 level are provided to the comparator 326 as a feedback voltage and reference voltage, respectively (although this designation is used solely for purposes of convenient discussion). The output of the comparator is connected to the bias of both the replicated UP current source and the main UP current source. By adjusting the bias level of the UP current sources, the ON resistance of the sources will change. As the ON resistance of the UP voltage source changes, the $V_{REF}$ voltage level, which is equivalent to the voltage level where the UP and DOWN currents will be matched, will change. The comparator and the replica bias circuitry create a closed-loop system that will adjust the bias to the UP current source to maintain the voltage level of $V_{REF}$ equal to the charge pump output voltage. This maintains the condition that the voltage level at which the UP and DOWN currents are matched is the same voltage as the output of the charge pump with two assumptions. First, the bandwidth of the comparator is much higher than the response of the charge pump output. Second, the charge pump output voltage must be within the valid operation region of the current sources.

The comparator 326 has a first input 321, a second input 323, and an output 325, and provides a control signal 327 to the replica UP current source 328 and to UP current source 302. Without the compensation, as $V_{OUT}$ increases the voltage across the UP current source will decrease, causing the output current to decrease due to the output impedance of the current source. Similarly, the voltage across the DOWN current source will increase, causing the output current to increase due to the output impedance of the current source. The comparator and replica bias circuitry compensates for this by increasing the bias to both the UP current source 302 and to the replica UP current source 328 to maintain the replica voltage $V_{REF}$ 336 essentially equal to the output voltage $V_{OUT}$ 120. The close physical proximity of the replica current sources 328, 330 to each other and to the charge pump current sources 302, 304 insures that each device is similarly processed, so that the operating characteristics are similar. Additionally, the close physical proximity of these devices insures that they are at essentially the same ambient temperature, and track each other as temperature changes. In this state of equilibrium when $V_{OUT}$ equals $V_{REF}$, the bias and voltage across the UP current source and the replica UP current source will be the same, making current through each the same, or, if the replica current source is a scaled version of the main current source, the currents will match with the same scaling factor. Similarly the bias and voltage across the DOWN current source and the replica DOWN current source will be the same, making the current though each the same, or, if the replica current source is a scaled version of the main current source, the currents will match with the same scaling factor.

The only path for current flow through the replica bias circuitry is through both current sources, which ensures that the current through the replica UP current source equals that through the replica DOWN current source. The current through the main UP current source will equal that of the main DOWN current source because the bias condition between the replica current sources and the main current sources are the same. As the output impedance of the UP current source increases, decreasing the charge transferred on each UP control signal 114, the comparator 326 increases the bias to both the UP current source 302 and to the replica UP current source 328 to maintain the replica voltage $V_{REF}$ essentially equal to the output voltage $V_{OUT}$. The close physical proximity of the replica current sources 328, 330 to each other and to the charge pump current sources 302, 304 insures that each device is similarly processed, so that the operating characteristics are similar. Additionally, the close physical proximity of these devices insures that they are at essentially the same ambient temperature, and track each other as temperature changes.

The adjustment to the bias current of the UP current source 302 moves the equalization point of the charge pump 300 as the output voltage changes. For example, referring to the upper end of the VCO operating range 212 in FIG. 2A, if no adjustment to the UP current source occurs, the UP current 206 is undesirably low. The comparator 326 increases the bias to the UP current source 302 so that it produces more current at the upper end of the VCO operating range 212 in FIG. 2B, preferably so that the equalization point occurs at or near that operating voltage.

Similarly, the comparator would typically decrease the bias to the UP current source at the lower end of the VCO operating range. Alternatively, the comparator is single-sided. That is, the current source is originally set at a maximum or minimum bias and the comparator decreases or increases the bias, respectively. In this case, zero bias would equal $V_{CC}$ and full bias would equal ground. The bias should be increased to increase the current, implying that the voltage level of the bias will decrease in the case of a P-channel current source. The adjustment to the current source bias compensates for the voltage-dependant output impedance of the current source to obtain matched UP and DOWN currents at various output voltage levels. In an alternative embodiment, the bias to the UP current source is fixed, and the bias to the DOWN current source is adjusted. In other embodiments, the reference for the comparator is taken from any voltage source that approximates the voltage level of the charge pump output.

Figure 4A:
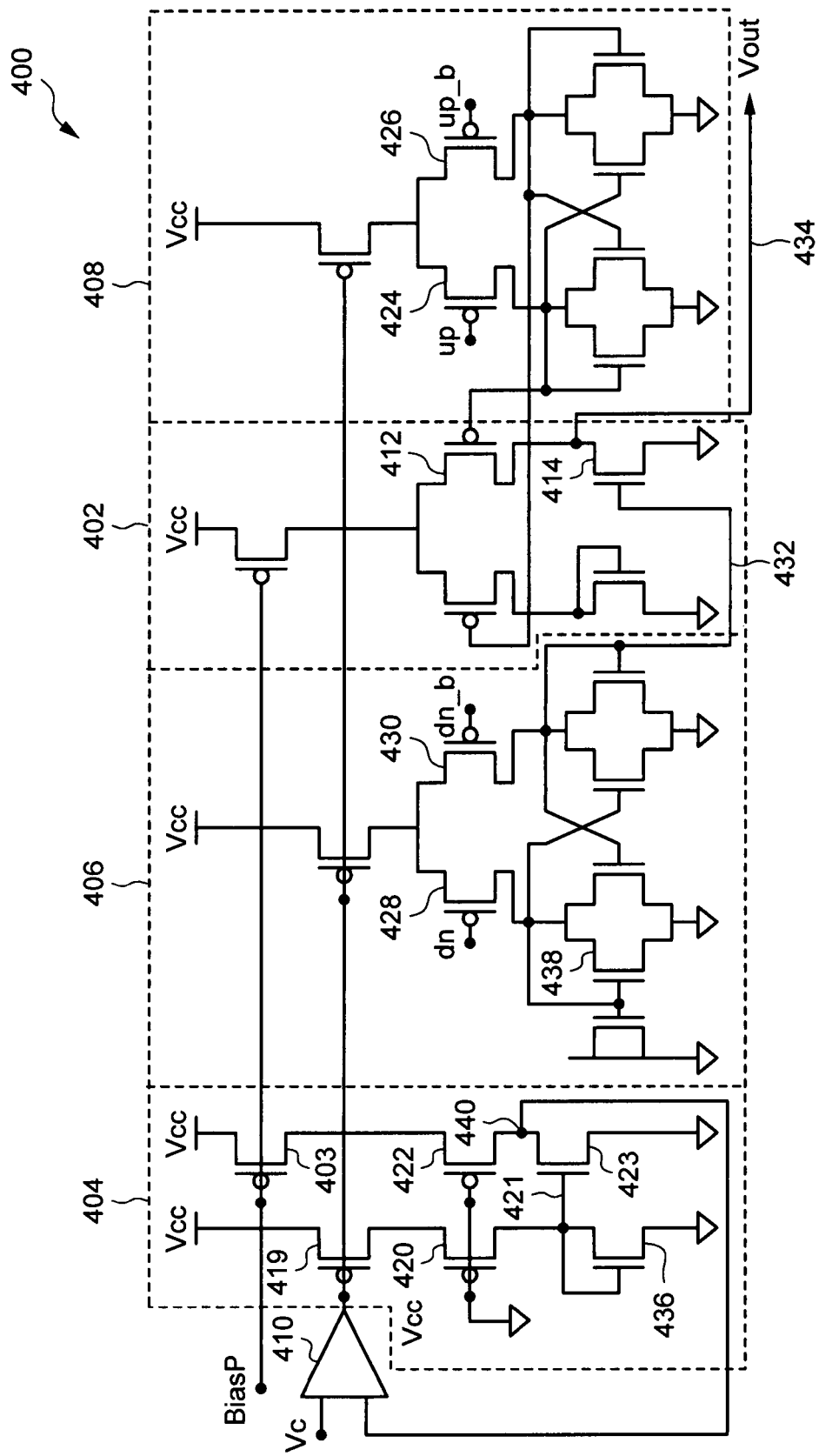
FIG. 4A is a diagram of a charge pump circuit according to an embodiment of the invention.

FIG. 4A is a diagram of a charge pump circuit 400 according to an embodiment of the invention. The charge pump circuit 400 includes a charge pump section 402, a charge pump replica section 404, a DOWN switch control section 406, an UP switch control section 408, and a comparator 410. The UP and DOWN switch control sections 408, 406 control the edge rates of the bias signals provided to the UP current source 412 and DOWN current source 414. Differential input signals UP, UP_b ("UP bar," namely, the inverse of UP), DN (DOWN), and DN_b are provided to the differential transistor pairs in the UP switch control section 408 and the DOWN switch control section 406, respectively. The differential input signals are generated by the phase/frequency detector circuitry (not shown, see FIG. 3, ref. num. 112). Additional explanation of an offset-cancelled charge pump with symmetric loads is found in the paper entitled *Low-Jitter Process-Independent DLL and PLL Based on Self-Biased Techniques*, by John G. Maneatis, IEEE Journal of Solid-State Circuits, Vol. 31, No. 11 (November 1996), which is hereby incorporated by reference for all purposes.

In the charge pump replica section 404, PMOS devices 420, 422 are biased by $V_{CC}$ to mimic the ON resistance of the PMOS devices 424, 426, 428, 430 in the UP and DOWN switch control sections 408, 406. The differential input signals provided to the PMOS devices 424, 426, 428, 430 in the UP and DOWN switch control sections 408, 406 only turn ON one device in each section at any time. Thus, the PMOS devices 420, 422 in the charge pump replica section 404 provide the ON switch resistance discussed in relation to reference numerals 332, 334 in FIG. 3.

The diode-connected NMOS device 436 in the charge pump replica section 404 mimics the diode-connected NMOS device 438 in the DOWN switch control section 406 when the DN signal is HIGH, for example. The N-channel bias 432 in this embodiment is adjusted to control the discharge from the output 434 according to the output level $V_{OUT}$ and the feedback from node 440. The device stack 419, 420, 436 replicates block 406 when the DOWN signal is HIGH. The output 421 of this device stack drives into a second stack of devices 403, 422, 423 that replicate the output stage 432 when both the DOWN and UP signals are HIGH. The comparator 410 adjusts the bias to the replicated P-channel current source 419 to keep the voltage at node 440 equal to $V_{OUT}$ 434. In this embodiment, the comparator 410 adjusts the current sources 419, 423 to equalize the UP and DOWN currents.

Figure 4B:
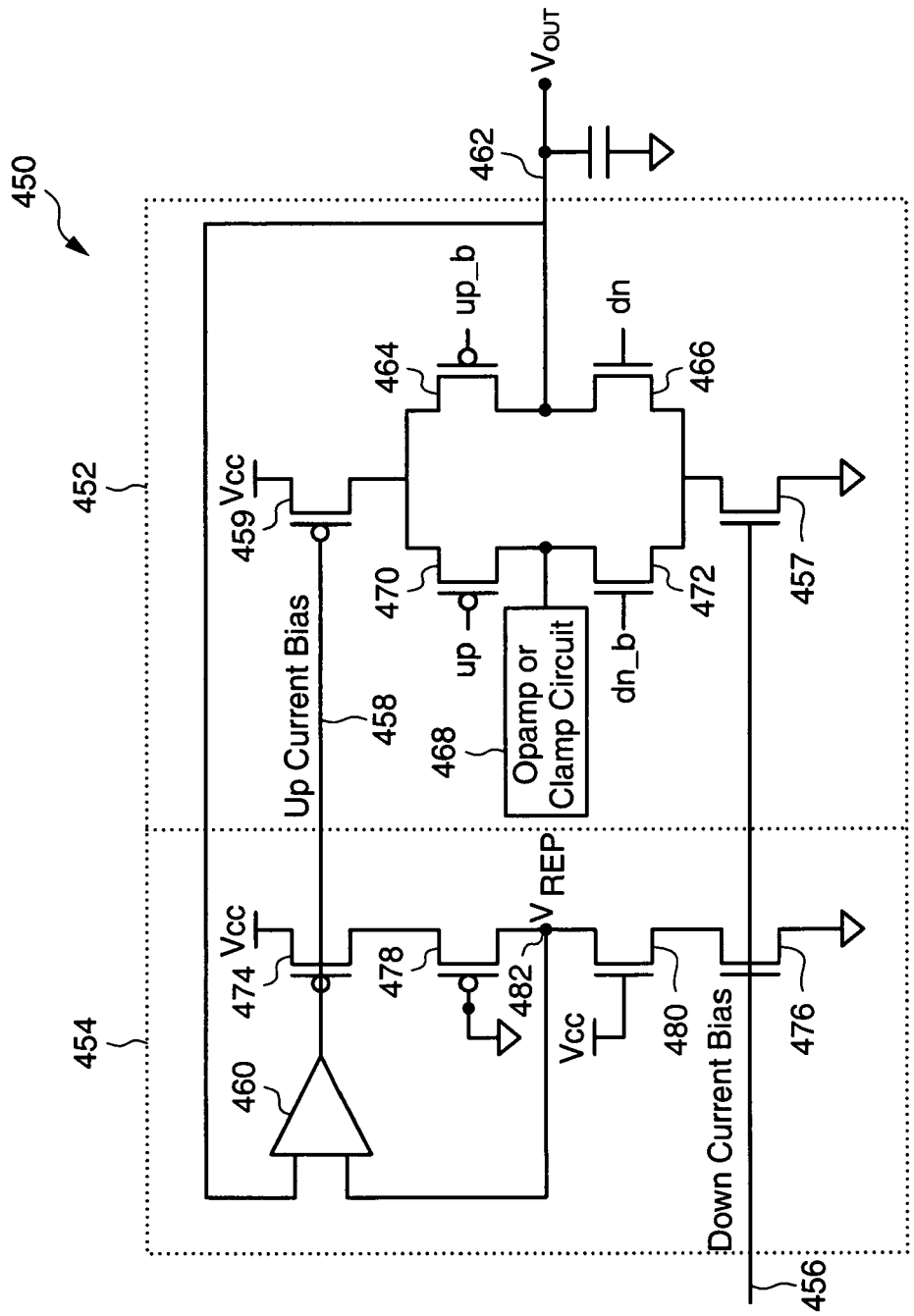
FIG. 4B is a diagram of a charge pump circuit according to another embodiment of the invention.

FIG. 4B is a diagram of a charge pump circuit 450 according to another embodiment of the invention. The charge pump circuit 450 has a charge pump section 452 and a charge pump replica section 454. The DOWN current bias 456 of the DOWN current source 457 is set using a voltage reference, such as a bandgap reference. The UP current bias 458 of the UP current source 459 is adjusted by a comparator 460.

The UP current source 459 is coupled to the output 462 through PMOS switch 464 when the UP_b signal (generated by a phase/frequency detector (not shown), for example) closes the PMOS switch 464. UP_b closes the PMOS switch 464 when UP is HIGH. Similarly, the DOWN current source 457 is coupled to the output 462 through NMOS switch 466 when NMOS switch 466 is closed. NMOS switch 466 is closed when DN is HIGH. The terms "UP, DOWN, LOW and HIGH" are merely used for convenience of illustration, and alternative embodiments use different signal levels and device types.

It is desirable to leave the UP and DOWN current sources on (i.e. biased), even when they are not coupled to the output 462. Otherwise, charge can accumulate on the drain of the current source(s) that is coupled to the output when the switch is closed, resulting in an inaccurate charge transfer. A current sink 468, such as an opamp or clamp circuit, is used so that the current sources can stay on, even when they are not coupled to the output.

For example, when the phase/frequency detector signals an UP increment (i.e. UP goes HIGH and UP_b goes LOW), the PMOS switch couples the UP current source 459 to the output 462. If an UP increment is not required, UP is LOW and UP_b is high. This turns on the symmetric (matched) PMOS switch 470, coupling the UP current source 459 to the current sink 468. The charge pump circuit works in a similar fashion for DOWN increments. If a DOWN increment is not required, DN is LOW and DN_b is HIGH, which couples the DOWN current source 457 to the current sink 468 through the symmetric NMOS switch 472 If both UP and DOWN are LOW (i.e. no adjustment to $V_{OUT}$ is required) then current generally flows from the UP current source 459 to ground through the DOWN current source 457 and symmetric switches 470, 472.

The charge pump replica section 454 includes a replica UP current source 474, a replica DOWN current source 476, and replica switches 478, 480. The gate of the PMOS replica switch 478 is connected to ground, and the gate of the NMOS replica switch 480 is connected to $V_{CC}$. Thus, the replica switches 478, 480 are always closed.

The replica current sources 474, 476 and switches 478, 480 provide a resistance string that produces a replica voltage $V_{REF}$ at node 482. The comparator 460 compares the output voltage $V_{OUT}$ to the replica voltage $V_{REF}$, and adjusts the UP current bias to equalize the current from the UP and DOWN current sources, as explained above in reference to FIG. 3. The replica voltage moves slightly as the UP current bias is changed, and insures that the equalization point (see FIG. 2B, ref. num. 212) occurs at the output voltage $V_{OUT}$ across the VCO range.

Figure 5:
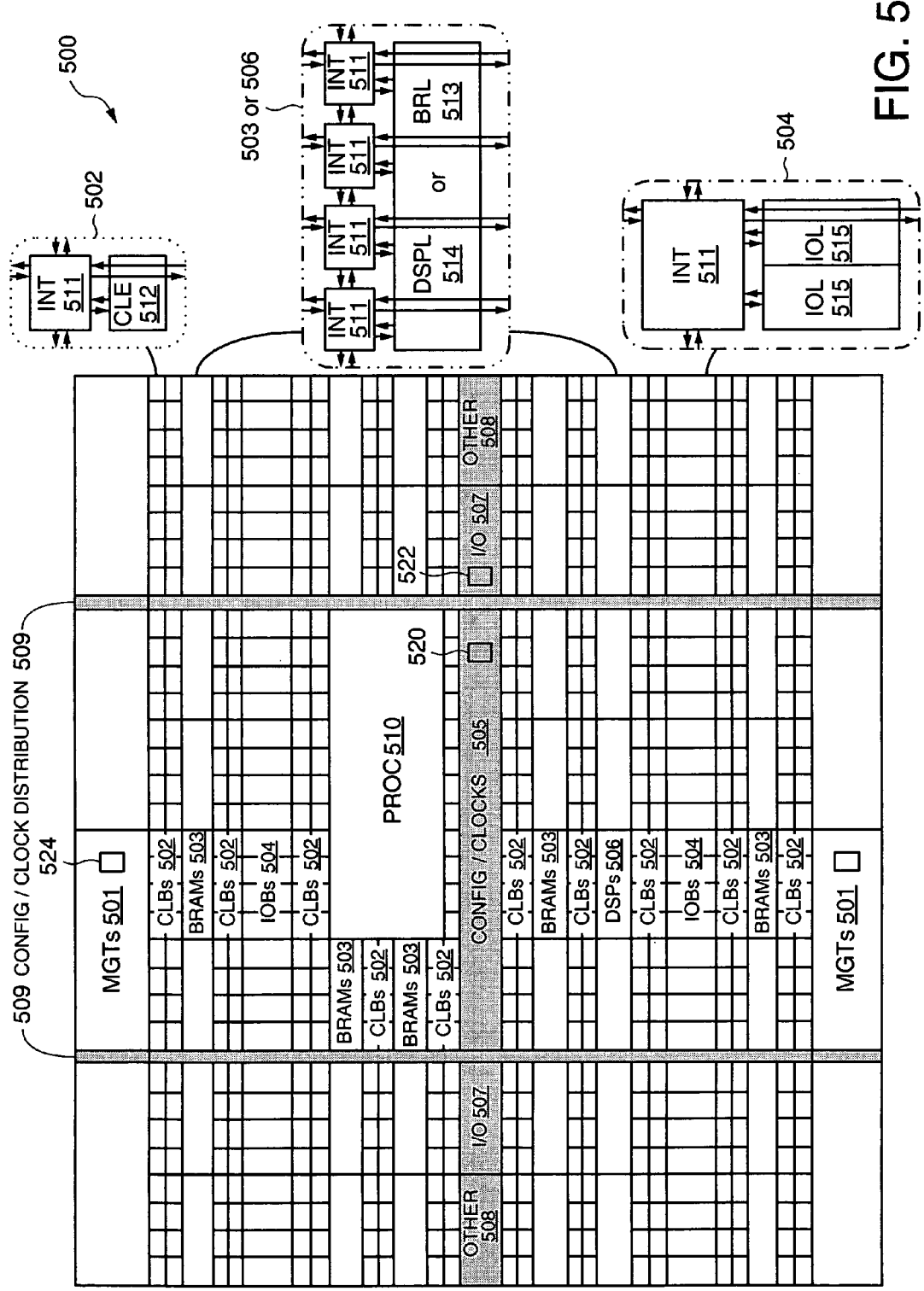
FIG. 5 is a diagram of a field-programmable gate array with a charge pump circuit according to an embodiment of the invention.

FIG. 5 is a diagram of a field-programmable gate array ("FPGA") 500 with a charge pump circuit according to an embodiment of the invention. The FPGA architecture includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An 10B 504 can include, for example, two instances of an input/output logic element (IOL 515) in addition to one instance of the programmable interconnect element (INT 511). As will be clear to those of skill in the art, the actual I/O pads connected, for example, to the I/O logic element 515 are manufactured using metal layered above the various illustrated logic blocks, and typically are not confined to the area of the input/output logic element 515.

In the pictured embodiment, a columnar area near the center of the die (shown shaded in FIG. 5) is used for configuration, clock, and other control logic. A charge pump circuit 520 according to an embodiment of the invention is included in the clock configuration block 505. Horizontal areas 509 extending from this column are used to distribute the clocks and configuration signals across the breadth of the FPGA.

Other charge pump circuits 522, 524 are optionally included in other functional blocks of the FPGA 500, such as in an I/O block 507 or in an MGT 501. Charge pump circuits according to embodiments of the invention are particularly desirable for use in deskewing clock signals on clock networks, generating or regenerating clock signals, synchronizing local clock signals with global clock signals, frequency synthesis, clock and data recovery circuits in IOs, delay lock loops ("DLLs"), and jitter attenuation.

Figure 1:
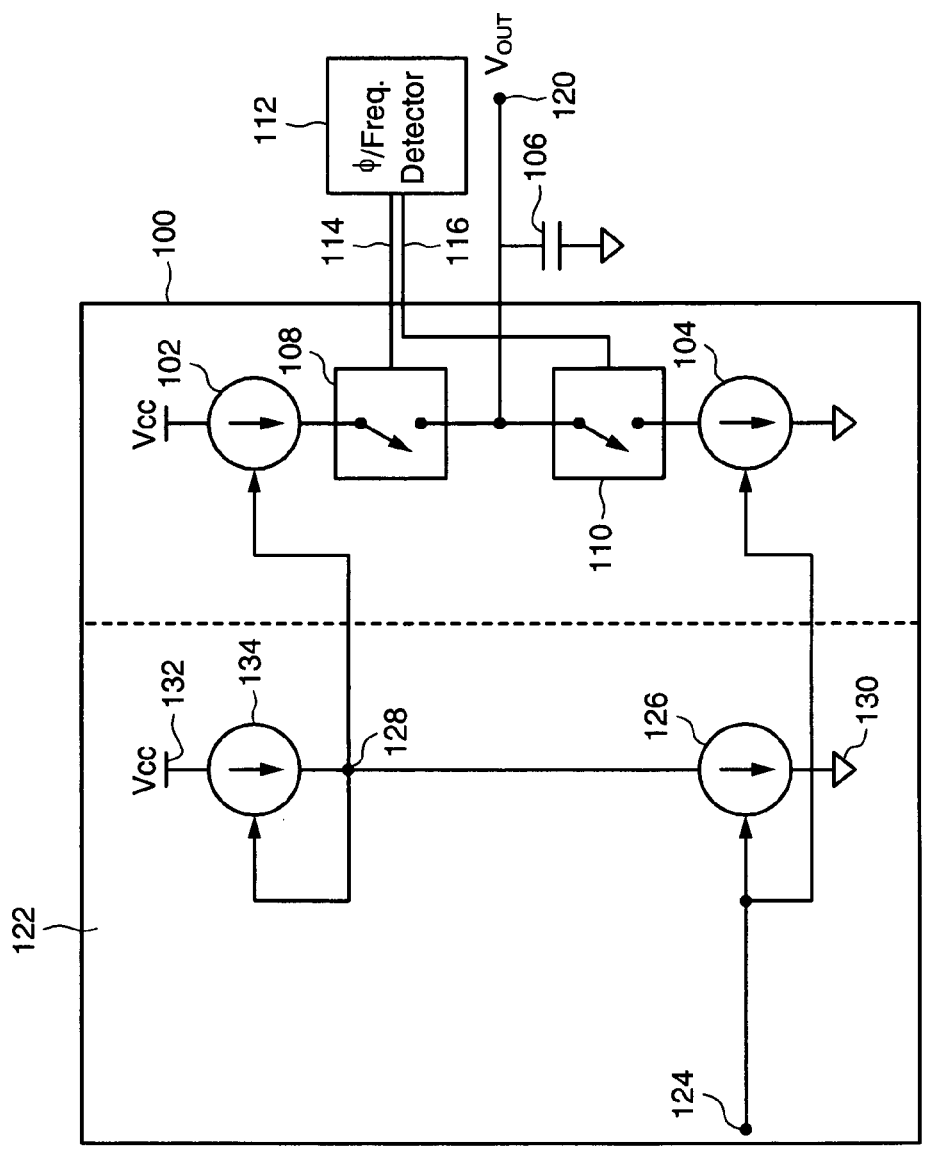
FIG. 1 is a diagram of a conventional charge pump.

Charge pump circuits according to embodiments of the invention are particularly suitable and desirable for reducing static phase offset in a PLL, and more particularly in an FPGA. Static phase offset is of particular concern in an FPGA because the operating range of such a programmable logic device can vary widely, according to the customer's application. Static phase offset directly affects (i.e. reduces) the timing window in an application. An embodiment of the invention is predicted to reduce static phase offset by a factor of five (i.e. to one-fifth of the static phase error produced by a charge pump as shown in FIG. 1), thus providing greater timing margin in the customer's application.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

Figure 6:
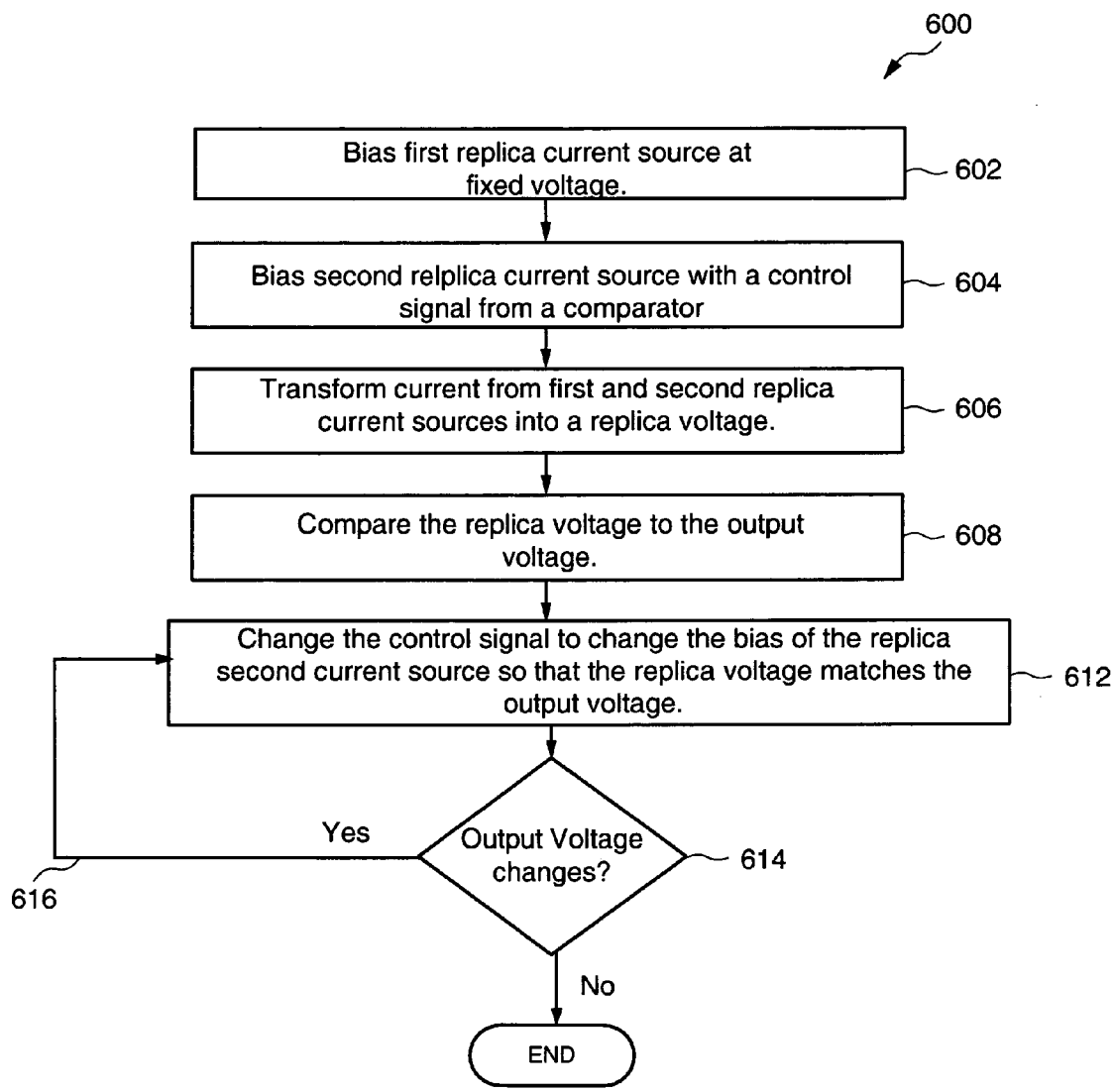
FIG. 6 is a flow chart of a method of operating a charge pump circuit according to an embodiment of the invention.

FIG. 6 is a flow chart of a method 600 of operating a charge pump circuit according to an embodiment of the invention. A first replica current source, e.g., 330, is biased at a constant bias level (step 602) and a second replica current source, e.g., 328, is biased with a control signal from a comparator, e.g., 326 (step 604). Current from a first current source and from a second current source is transformed into an output voltage, e.g. $V_{OUT}$ 120, at an output of the charge pump circuit (not shown). And current from the first replica current source and from the second replica current source is transformed into a replica voltage, e.g., $V_{REP}$ 336 (step 606). A comparator compares the output voltage, e.g. $V_{OUT}$ 120, at a first input of the comparator to the replica voltage, e.g., $V_{REP}$ 336, at a second input of the comparator (step 608).

A control signal from the comparator is changed to change the bias of a replica second current source so that the replica voltage matches the output voltage (step 612). If the output voltage changes (decision 614), the control signal is again changed (branch 616) so that the replica voltage matches, i.e., is substantially equal to, the output voltage.

In a particular embodiment, the reference voltage is produced in a replica charge pump section having a first replica current source in series with a first resistive element, a second resistive element, and a second replica current source. The reference voltage is taken from a node between the first and second resistive elements. In a further embodiment, the first and second resistive elements are replica switch devices that replicate switches between the first and second current sources and the output. The replica switch devices are biased to remain in a CLOSED condition.

While the present invention has been described in connection with specific embodiments, variations of these embodiments will be obvious to those of ordinary skill in the art. For example, a reference voltage has been described in terms of replica current sources and replica switches forming a resistive string. Other resistive elements are alternatively used. Similarly, the reference voltage can be taken from any voltage source or node that approximates the voltage level of the charge pump output, or the replicated switches in the replica bias sections can be removed, reducing performance, if acceptable. Therefore, the spirit and scope of the appended claims should not be limited to the foregoing description.

The invention claimed is:

1. A charge pump circuit comprising:
an output providing a reference voltage;
a first switch;
a second switch;
a first current source selectively coupled to the output through the first switch, the first current source generating a first current according to a constant bias voltage;
a second current source selectively coupled to the output through the second switch, the second current source generating a second current according to a control signal; a node having a feedback voltage at which the first current will match the second current;
a comparator having a first input coupled to the reference voltage, a second input coupled to the feedback voltage, and an output providing the control signal to the second current source;
a current sink;
a third switch selectively coupling the first current source to the current sink; and
a fourth switch selectively coupling the second current source to the current sink.

2. The charge pump circuit of claim 1 wherein the first current source is a first transistor and the second current source is a second transistor.

3. The charge pump circuit of claim 1 wherein the first current source is an N-type metal-oxide-semiconductor transistor and the second current source is a P-type metal-oxide semiconductor transistor.

4. The charge pump circuit of claim 1 wherein the first current source is a P-type metal-oxide-semiconductor transistor and the second current source is an N-type metal-oxide semiconductor transistor.

5. The charge pump circuit of claim 1 wherein the first resistive element is a first replica switch in a continuously closed condition and the second resistive element is a second replica switch in a continuously closed condition.

6. The charge pump circuit of claim 5 wherein the first switch is a first metal-oxide-semiconductor ("MOS") transistor of a first type and the first replica switch is a second MOS transistor of the first type; and the second switch is a third MOS transistor of a second type and the second replica switch is a fourth MOS transistor of the second type.

7. The charge pump circuit of claim 1 wherein the control signal biases the second current source so that the second current supplied by the second current source at the output voltage is essentially equal to the first current supplied by the first current source at the output voltage.

8. A programmable logic device having a charge pump circuit according to claim 1.

9. The programmable logic device of claim 8 wherein the charge pump circuit is included in a phase-looked loop of the programmable logic device.

10. The programmable logic device of claim 8 wherein the programmable logic device comprises a field-programmable gate array.

11. The programmable logic device of claim 10 wherein the charge pump circuit is included in a clock circuit of the field-programmable gate array.

12. The charge pump circuit of claim 1 wherein the first resistive element is a first metal-oxide-semiconductor ("MOS") transistor with a first gate terminal biased to a first voltage so as to maintain the first MOS transistor in a first ON condition.

13. The charge pump circuit of claim 12 wherein the second resistive element is a second MOS transistor with a second gate terminal biased to a second voltage so as to maintain the second MOS transistor in a second ON condition.

14. A method of operating a charge pump circuit comprising the steps of:
biasing a first current source at a constant bias level to provide a first current coupled to an output of the charge pump through a first switch when the first switch is ON and to a current sink when the first switch is OFF;
biasing a second current source with a control signal from a comparator to provide a second current coupled to the output of the charge pump through a second switch when the second switch is ON and to the current sink when the second switch is OFF;
coupling an output voltage of the charge pump circuit to the comparator;
producing a replica voltage in a replica charge pump section having a first replica current source in series with a first resistive element, a second resistive element, and a second replica current source, the first resistive element continuously replicating a first ON resistance of the first switch and the second resistive element continuously replicating a second ON resistance of the second switch, the second replica current source biased with the control signal and coupled to the node through the second resistive element;
coupling the replica voltage to the comparator; and
changing the control signal so as to change a bias of the replica second current source so that the replica voltage matches the output voltage.

15. The method of claim 14 wherein the step of producing the replica voltage includes flowing a replica current through the first replica current source and flowing the replica current through the second replica current source.

16. The method of claim 14 wherein the replica second current source is metal-oxide-semiconductor ("MOS") transistor and the control voltage increases the bias of the MOS transistor with increasing output voltage.

17. The method of claim 14 wherein the replica second current source is a metal-oxide-semiconductor ("MOS") transistor and the control voltage decreases the bias of the MOS transistor with increasing output voltage.

18. The method of claim 14 wherein the first current source is a first metal-oxide-semiconductor ("MOS") transistor and the second current source is a second MOS transistor, the first transistor having a first output current at an equilibrium output voltage and the second transistor having a second output current essentially equal to the first output current at the equilibrium output voltage, the control signal changing the bias of the second transistor so that the second output current essentially equals the first output current at an operating output voltage not equal to the equilibrium output voltage.

* * * * *